United States Patent [19]
Shrout et al.

[11] 4,330,593
[45] May 18, 1982

[54] PZT/POLYMER COMPOSITES AND THEIR FABRICATION

[75] Inventors: Thomas R. Shrout, Erie; Walter A. Schulze; James V. Biggers, both of State College, all of Pa.

[73] Assignee: The United States of America as represented by the Secretary of the Navy, Washington, D.C.

[21] Appl. No.: 206,732

[22] Filed: Nov. 13, 1980

[51] Int. Cl.³ .................. B32B 5/16; B05D 5/12; B32B 15/08; H04R 17/00
[52] U.S. Cl. ........................ 428/407; 29/25.35; 252/62.9; 310/358; 427/100
[58] Field of Search ............ 428/407, 403; 427/100; 252/62.9; 310/358; 29/25.35

[56] References Cited

U.S. PATENT DOCUMENTS 4,076,892  2/1978  Fennimore et al. .......... 428/407
4,227,111  10/1980  Cross et al. .................. 252/62.9 X Primary Examiner—Thomas J. Herbert, Jr.
Attorney, Agent, or Firm—R. S. Sciascia; P. C. Lall; A. P. Durigon

[57] ABSTRACT

PZT/polymer composites and a simplified method of their fabrication are described. Commercially available PZT Pb(Zr, Ti)O$_3$ powder is thoroughly mixed with a binder such as polyvinylalcohol and polymethyl methacrylate (PMM) spheres and pressed into pellets. The binder and PMM spheres are burnt out by heating pellets slowly and the porous pellets so obtained are sintered by heating them in closed high-purity alumina crucibles and lead zirconate as a source of lead is added thereto. The highly porous pellets thus obtained are impregnated with a suitable polymer such as silicone rubber elastomer or vinylcyclohexene dioxide epoxy.

6 Claims, No Drawings

PZT/POLYMER COMPOSITES AND THEIR FABRICATION

BACKGROUND OF THE INVENTION

This invention relates to piezoelectric materials for transducers and, more particularly, to PZT/polymer composites and a simplified fabrication method thereof.

Many efforts have been made to improve electromechanical properties of homogeneous piezoelectric materials. As an example, Skinner et al as described in U.S. Pat. No. 4,227,111 to Cross et al., developed a flexible PZT (lead zirconate titanate) polymer composite transducer in which the two phases formed interpenetrating 3-dimensional networks. This form of diphasic connectivity is referred to as a 3:3 structure. Such a composite was designed to take maximum advantage of the useful properties of each phase. The resultant composite had a low density for improved acoustic coupling to water or human tissue, and was compliant to resist mechanical shocks and provided high damping (low mechanical Q) and flexibility, thus making it possible to fabricate a conformable detector. The composites exhibited a very large piezoelectric voltage coefficient. Skinner et al prepared their composites utilizing a coral replamine process. Their process included the use of a natural coral infused with wax. Hydrochloric acid was used to dissolve the coral. A PZT slurry was used to impregnate the wax form and then sintered to make a PZT "coral" structure. The sintered structure was then impregnated with an epoxy or other suitable material. However, Skinner's approach is not easily useable for manufacturing purposes of such materials because of its use of natural coral and lack of reproducibility of the composites so obtained. It is thus desirable to have a method of preparing PZT/polymer composites which is simple and which produces desirable transducer materials with reproducible results.

SUMMARY OF THE INVENTION

Subject invention describes PZT/polymer composites and a simple method of their fabrication. A commerially available PZT powder is mixed with a polymer such as polymethyl methacrylate (PMM) spheres. Pellets of diameter 25 mm are pressed from the mixture and heated slowly over a long period of time in a silicon carbide resistance furnace. The samples are then allowed to cool and are easily vacuum impregnated with one of the polymers, i.e. a high purity silicone rubber elastomer or a stiff vinylcyclohexene dioxide epoxy.

An object of subject invention is to have a simplified method of fabricating high quality PZT/polymer composites.

Another object of subject invention is to fabricate 3:3 connectivity PZT/polymer composites by utilizing a simpler fabrication method than the coral replamine process.

Still another object of subject invention is to fabricate high quality PZT/polymer composites which is industrially feasible for manufacture.

Still another object of subject invention is to fabricate PZT/polymer composites with reproducible results.

DESCRIPTION OF A PREFERRED EMBODIMENT

Briefly and in somewhat general terms the above objects of invention are accomplished by using a commercially available PZT powder, preferably ultrasonic powder PZT-501A from Ultrasonic Powders, Inc. PZT powder is thoroughly mixed with polymethyl methacrylate (PMM) spheres in a 30/70 volume ratio. PMM spheres ranged between 50 and 150 microns ($150 \times 10^{-6}$ meters) in diameter and the PZT powder size ranged between one and four mirons. Pellets preferably of diameter 25 mm were pressed from the mixture, using a few weight percent of polyvinylalcohol for enhancing green strength. The pellets were heated slowly to 400° C. over a 12-hour period to volatilize the PMM spheres. A slow heating rate was used to prevent excessive cracking. Sintering was done in closed high-purity alumina crucibles. The pellets were placed on platinum foil and lead zirconate was added as a source of PbO. A silicon carbide resistance furnace with a programmable controller was used and the heating rate of 200° C. per hour with a soak temperature of 1305° C. for a period of 0.5 hours was used. The samples were allowed to cool in the furnace with power off. The highly porous pellets thus obtained were easily vacuum impregnated with either a high-purity silicone rubber elastomer or a stiff vinylcyclohexene dioxide epoxy. Electrodes of sputtered on gold and/or air-dry silver were applied. Dielectric permittivity and loss (tan δ) were measured using an automatic capacitance bridge at 1 KHz (kiloherz). The composites were poled in a stirred oil bath at 80°–90° C. by applying a DC field ranging from 15–30 Kv/cm for at least 5 minutes. The completeness of poling was checked after 24 hours by measuring the piezoelectric $d_{33}$ coefficient using a "Berlincourt" $d_{33}$ meter. Hydrostatic piezoelectric coefficient, $d_h$ was determined by a pseudostatic method. Pressure was changed at a rate of 500 psi/sec., while charge was collected by a Keithly Electrometer in the feedback charge integration mode.

Properties reported in Table 1 as shown on the folowing page present direct comparison between the prior art composites such as Skinner's replamine composites and those fabricated according to the teachings of subject invention (to the homogeneous PZT-501A transducer material).

TABLE 1

| property | homogeneous PZT/501A | (Prior Art) Skinner's Replamine Composites | | (New) PMM Composites | |
|---|---|---|---|---|---|
| | | PZT/Silicone Rubber | PZT/Spurrs | PZT/Silicone Rubber | PZT/Spurrs |
| density (g/cm³) | 7.9 | 3.3 | 3.3 | 2.8 | 2.8 |
| dielectric breakdown (Kv/cm) | 30–40 | 15–20 | 15–29 | >25 | 25–35 |
| | | unbroken / broken | | unbroken / broken | |
| dielectric constant (k) | 2000 | ~100 / ~40 | ~100 | 100–200 / 40–100 | 100–250 |
| piezo $d_{33}$ | 400 | 120–180 / 90–100 | 140–160 | 160–240 / 80–100 | 60–110 |

TABLE 1-continued

| property | homogeneous PZT/501A | (Prior Art) Skinner's Replamine Composites | | (New) PMM Composites | |
|---|---|---|---|---|---|
| | | PZT/Silicone Rubber | PZT/Spurrs | PZT/Silicone Rubber | PZT/Spurrs |
| $(\times 10^{-12}$ C/N) | | | | | |
| $g_{33}$ $(\times 10^{-3}$ Vm/N) | 20 | 135–200 | ~280 | 160–180 | 112–220 · 90–230 · 60–112 |
| $g_h$ $(\times 10^{-3}$ Vm/N) | 4 | — | ~30 | — | 190 · 50–70 · 15–25 · ~40 |

Table 2 shows a comparison of physical and mechanical properties determined by resonance.

TABLE 2

| property | homogeneous PZT-501A | New PPM composites PZT/Silicone Rubber Composite | New PZT/Spurrs Composite |
|---|---|---|---|
| Young's modulus $Y_{33}'$ $(\times 10^{+10}$ N/M$^2$) | 6.8 | 0.25 | 1.3 |
| thickness coupling coef. $k_T$ (%) | ~60 | 25–30 | 17–23 |
| mechanical Q (thickness) | ~70 | 10–15 | 16–25 |
| frequency constant $N_{thickness}$ (Hz · m) | ~2100 | 530–550 | 1050 |

It can be seen that compliance of PZT/polymer composites was much higher than homogeneous PZT. The thickness coupling factor ($k_t$) was reduced by a factor of 2–3 and mechanical Q values were found to be quite low, suggesting that PMM composite material may be applicable with little external damping.

Briefly stated, PZT/polymer composites are fabricated by mixing commercially available PZT powder thoroughly with polymethyl methacrylate (PMM) spheres and is pressed into pellets. The pellets are sintered by heating them slowly in closed high purity alumina crucibles and lead zirconate is added to them. The highly porous pellets thus obtained are impregnated with a suitable polymer to give desirable properties to the composites.

Obviously, many modifications and variations of the present invention are possible in the light of the above teachings. As an example, the ratio of PZT powder and the polymer used may be varied. Furthermore, the temperature and the duration of sintering process can be varied. Besides, the polymer used for impregnating the highly porous pellets can be selected from a group of compounds depending upon the properties desired for the PZT composite for the fabrication of acoustic transducers. Furthermore, different types of PZT and other families of piezoelectric ceramics such as those based on BaTiO$_3$ and Pb Nb$_2$O$_6$ may be used.

It is, therefore, to be understood that within the scope of the appended claims the invention may be practiced otherwise than as specifically described.

What is claimed is:

1. Method for fabricating PZT/polymer composites from commercially available PZT powder which comprises the steps of:
   mixing the PZT powder with a binder and plurality of polymethyl methacrylate (PMM) spheres and making a plurality of pellets thereof;
   sintering said plurality of pellets to burn said plurality of PMM spheres and thus making said plurality of pellets porous;
   adding lead zirconate to said plurality of porous pellets; and
   impregnating said plurality of porous pellets with silicone rubber elastomer.

2. The method of claim 1 wherein the sintering said plurality of pellets includes slow heating to avoid cracking thereof.

3. The method of claim 2 wherein the steps of impregnating said plurality of porous pellets includes the use of vinylcyclohexene dioxide epoxy.

4. PZT/polymer composites for fabricating acoustic transducers which comprise:
   a commercially available powder thoroughly mixed with a plurality of polymethyl methacrylate (PMM) spheres and polyvinylalcohol formed and sintered into a plurality of porous pellets;
   lead zirconate added to said plurality of porous pellets; and
   a polymer impregnated into said plurality of porous pellets containing lead zirconate.

5. PZT/polymer composites of claim 4 wherein said polymer is silicone rubber elastomer for providing flexibility to said PZT/polymer composites.

6. PZT/polymer composites of claim 4 wherein said polymer is vinylcyclohexene dioxide epoxy.

* * * * *